(12) United States Patent
Matsumoto et al.

(10) Patent No.: US 8,998,463 B2
(45) Date of Patent: Apr. 7, 2015

(54) LIGHT-EMITTING APPARATUS AND AUTOMOTIVE HEADLAMPS

(75) Inventors: Akihiro Matsumoto, Shizuoka (JP); Tetsuya Suzuki, Shizuoka (JP); Tomoyuki Nakagawa, Shizuoka (JP); Akitaka Kanamori, Shizuoka (JP); Takayuki Saito, Shizuoka (JP); Kaname Miyagishima, Shizuoka (JP); Hiroki Fujimura, Shizuoka (JP)

(73) Assignee: Koito Manufacturing Co., Ltd., Minato-Ku, Tokyo (JP)

( * ) Notice: Subject to any disclaimer, the term of this patent is extended or adjusted under 35 U.S.C. 154(b) by 500 days.

(21) Appl. No.: 13/394,100

(22) PCT Filed: Aug. 25, 2010

(86) PCT No.: PCT/JP2010/005243
§ 371 (c)(1),
(2), (4) Date: Mar. 7, 2012

(87) PCT Pub. No.: WO2011/027516
PCT Pub. Date: Mar. 10, 2011

(65) Prior Publication Data
US 2012/0155101 A1 Jun. 21, 2012

(30) Foreign Application Priority Data

Sep. 3, 2009 (JP) ................................. 2009-203908

(51) Int. Cl.
*B60Q 1/00* (2006.01)
*F21S 8/10* (2006.01)
*F21V 29/00* (2006.01)
(Continued)

(52) U.S. Cl.
CPC ............ *F21S 48/328* (2013.01); *B60Q 1/0094* (2013.01); *F21S 48/1159* (2013.01); *F21V 29/004* (2013.01); *F21V 29/225* (2013.01);
(Continued)

(58) Field of Classification Search
CPC ............................ F21S 48/215; B60Q 1/2688
USPC .......................................................... 362/487
See application file for complete search history.

(56) References Cited

U.S. PATENT DOCUMENTS

2005/0201115 A1   9/2005   Ito et al.

FOREIGN PATENT DOCUMENTS

| JP | 2005259603 | 9/2005 |
| JP | 2007022479 | 2/2007 |

(Continued)

OTHER PUBLICATIONS

KIPO, Office Action in counterpart Korean Patent Application No. 10-2012-7007600 dated Jun. 3, 2013.

(Continued)

*Primary Examiner* — Joseph L Williams
(74) *Attorney, Agent, or Firm* — Buchanan Ingersoll & Rooney PC

(57) ABSTRACT

A light-emitting apparatus is provided with: a light-emitting module; a control circuit unit configured to control the lighting of the light-emitting module; a heat-radiating substrate configured to support the light-emitting module and the control circuit unit in such a manner as to recover the heat produced by the light-emitting module and the control circuit unit; and a connection support unit mounted on the heat-radiating substrate in such a state as to support an electrically conductive member by which to electrically connect the light-emitting module and the control circuit unit.

8 Claims, 8 Drawing Sheets

(51) Int. Cl.
  *F21Y 101/02* (2006.01)
  *H01L 33/58* (2010.01)
  *H01L 33/60* (2010.01)
  *H01L 33/64* (2010.01)

(52) U.S. Cl.
  CPC ............. *F21Y2101/02* (2013.01); *H01L 33/58* (2013.01); *H01L 33/60* (2013.01); *H01L 33/644* (2013.01)

(56) References Cited

FOREIGN PATENT DOCUMENTS

| | | |
|---|---|---|
| JP | 2008186796 | 8/2008 |
| JP | 2008262937 | 10/2008 |

OTHER PUBLICATIONS

Office Action (Notification of Reason(s) for Refusal) issued on Apr. 22, 2014, by the Japan Patent Office in corresponding Japanese Patent Application No. 2011-529786, and an English Translation of the Office Action. (6 pages).

International Preliminary Report on Patentability, Mar. 6, 2012, 9 pages, Switzerland.

International Search Report, Japanese Patent Office, Nov. 16, 2010, 4 pages, Japan.

Chinese Office Action for corresponding Chinese Patent Appln. No. 201080039286.4 dated Aug. 5, 2013, with English translation (15 pages).

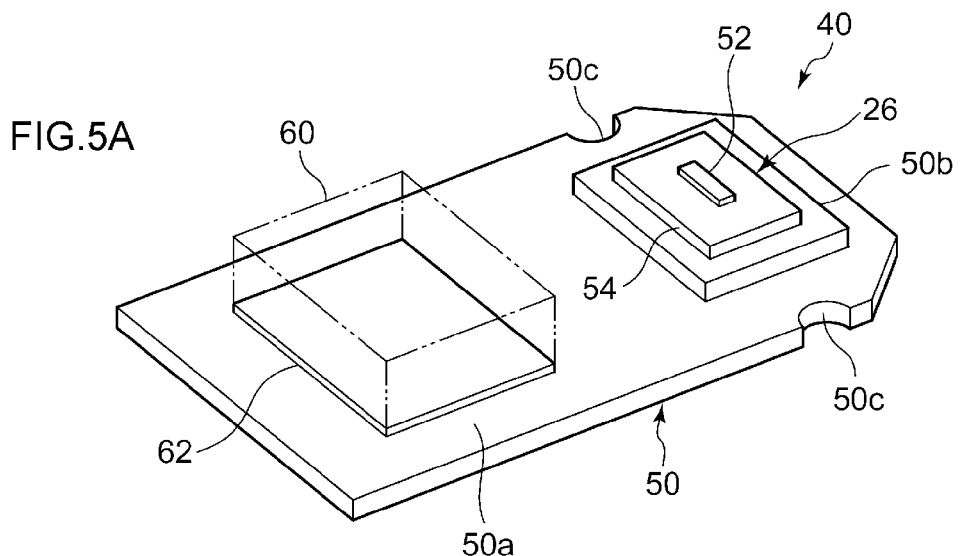
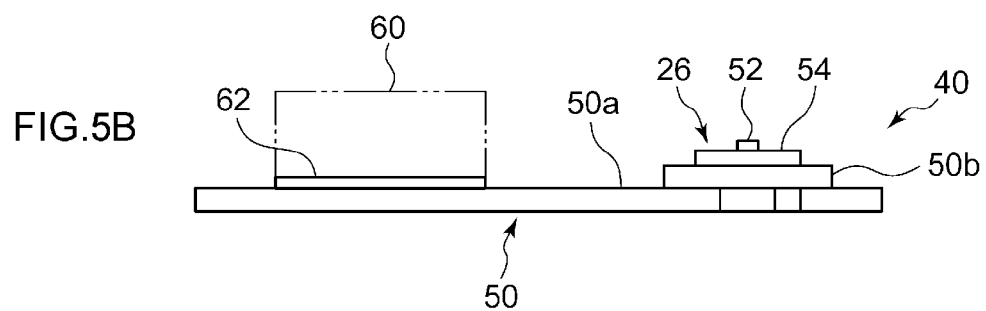
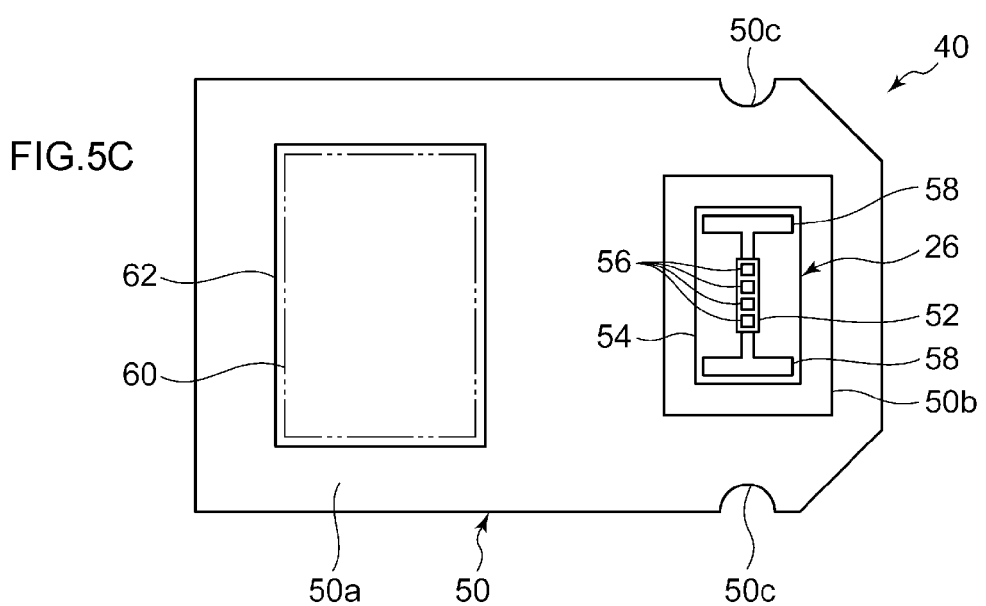

LIGHT-EMITTING APPARATUS AND AUTOMOTIVE HEADLAMPS

CROSS-REFERENCES TO RELATED APPLICATIONS

This is a U.S. national phase of PCT/JP2010/005243, International Filing Date 25 Aug. 2010, claiming priority from Japanese Application No. 2009-203908, filed 3 Sep. 2009.

BACKGROUND OF THE INVENTION

1. Field of the Invention

The present invention relates to a light-emitting apparatus and automotive headlamps and, in particular, to a light-emitting apparatus having a light-emitting module and a control circuit unit for controlling the lighting thereof and automotive headlamps having the light-emitting apparatus.

2. Description of the Related Art

In recent years, active developments have been going on for automotive headlamps using semiconductor light emitting elements such as LEDs (light emitting diodes). Proposed in this connection have been technologies for supporting both the light emitting elements and the lighting circuit components with a metallic substrate having a high thermal conductivity in order to ensure proper heat dissipation from these light emitting elements and lighting circuit components controlling the lighting thereof (see Patent Document 1, for example).

[Patent Document 1] Japanese Unexamined Patent Application Publication (Kokai) No. 2005-259603.

In wiring electrically conductive members on the metallic substrate as described in the above-cited patent document, it is not easy to reduce the cost because of the necessity for processes such as covering the conductive members with an insulating layer. On the other hand, it is required that a light emitting module and a control circuit unit for controlling the lighting thereof be electrically connected to each other with high reliability over a long time.

Thus, the present invention has been made to solve the above-described problems, and a purpose thereof is to electrically connect the light emitting module and the control circuit unit with each other in a simple structure while realizing excellent heat dissipation from them both.

DETAILED DESCRIPTION OF THE INVENTION

In order to resolve the above-described problems, a light-emitting apparatus according to one embodiment of the present invention includes: a light-emitting module; a control circuit unit configured to control the lighting of the light-emitting module; a heat-radiating substrate configured to support the light-emitting module and the control circuit unit in such a manner as to recover the heat produced by the light-emitting module and the control circuit unit; and a connection support unit mounted on the heat-radiating substrate in such a state as to support an electrically conductive member by which to electrically connect the light-emitting module and the control circuit unit.

By employing this embodiment, the process otherwise required for covering the heat-radiating substrate with an insulating layer and the like can be omitted, so that the cost for electrically connecting the light-emitting module to the control circuit unit can be suppressed. Also, the electrically conductive member can be supported in a simpler structure as compared with a case where the electrically conductive material is directly provided on the heat-radiating substrate. Thus, the light-emitting module and the control circuit unit can be electrically connected to each other with high reliability.

The light-emitting apparatus may further include a circuit unit support member mounted on the heat-radiating substrate. The control circuit unit may include a first circuit unit and a second circuit unit. The heat-radiating substrate may support the first circuit unit, and the circuit unit support member may support the second circuit unit in such a manner that when the circuit unit support member is mounted on the heat-radiating substrate, the second circuit unit is placed on the first circuit unit.

By employing this embodiment, compared with a case where, for example, the first circuit unit and the second circuit unit are arranged side by side on the same substrate, the area occupied by both the first circuit unit and the second circuit unit can be reduced. Thus, the area occupied by the light-emitting apparatus can be reduced.

The light-emitting apparatus may further include a substrate support member supporting the heat-radiating substrate. The heat-radiating substrate may be fixed to the substrate support member at a plurality of positions that straddle a center of a light-emitting section of the light-emitting module on a straight line passing through the center of the light-emitting section thereof.

By employing this embodiment, a portion of the heat-radiating substrate where the light-emitting section is supported can be contacted more reliably with the support member. Thus, the occurrence of a gap between the heat-radiating substrate and the support member is avoided and therefore the heat can be conducted more reliably from the heat-radiating substrate to the support member.

The heat-radiating substrate may be formed plane-symmetrically, and the heat-radiating substrate may support the light-emitting module in such a manner that a center of a light-emitting section is located on a plane of symmetry.

Another embodiment of the present invention relates to an automotive headlamp. The automotive headlamp includes a light-emitting apparatus; and an optical member configured to collect light emitted by the light-emitting apparatus, the light emitting apparatus including: a light-emitting module; a control circuit unit configured to control the lighting of the light-emitting module; a heat-radiating substrate configured to support the light-emitting module and the control circuit unit in such a manner as to recover the heat produced by the light-emitting module and the control circuit unit; and a connection support unit mounted on the heat-radiating substrate in such a state as to support an electrically conductive member by which to electrically connect the light-emitting module and the control circuit unit.

By employing this embodiment, provided is a light-emitting apparatus, having a highly reliable and low-cost structure, where the light-emitting module and the control circuit unit are connected to each other. Thus, low-cost automotive headlamps with high reliability can be provided.

The heat-radiating substrate may be formed plane-symmetrically, and the heat-radiating substrate may support the light-emitting module in such a manner that the center of a light-emitting section is located on the plane of symmetry. This embodiment allows the light-emitting apparatus to be used commonly by the automotive headlamps provided on both a left front part and a right front part of a vehicle, for instance. Thus, compared with a case where different light-emitting apparatuses are used in the left side and the right side of a vehicle, for instance, the overall cost can be reduced and the management and the like of spare parts can be made simpler.

An automotive headlamp according to this embodiment may further include a support member supporting the heat-radiating substrate. The heat-radiating substrate may be fixed to the support member at a plurality of positions that straddle the center of a light-emitting section of the light-emitting module on a straight line passing through the center of the light-emitting section thereof.

The optical members may include a reflector that reflects, through an inner surface of the reflector, light emitted by the light-emitting module and collects the reflected light, and the control circuit unit may be positioned in a region outside the reflector. In such a case, the electrically conductive member may be led from the control circuit unit to a spot more forward in a light-concentrating direction of the reflector than the light-emitting module in a manner such that a light path where light, in the light emitted by the light-emitting module, which is collected by the reflector, passes is avoided.

BRIEF DESCRIPTION OF DRAWINGS

Embodiments will now be described, by way of example only, with reference to the accompanying drawings which are meant to be exemplary, not limiting, and wherein like elements are numbered alike in several Figures, in which:

FIG. 5A is a perspective view of a first unit.

FIG. 5B is a side view of a first unit.

FIG. 5C is a top view of a first unit.

The preferred embodiments of the present invention (hereinafter referred to as "embodiments") will be described in detail with reference to the accompanying drawings.

Figure 1:
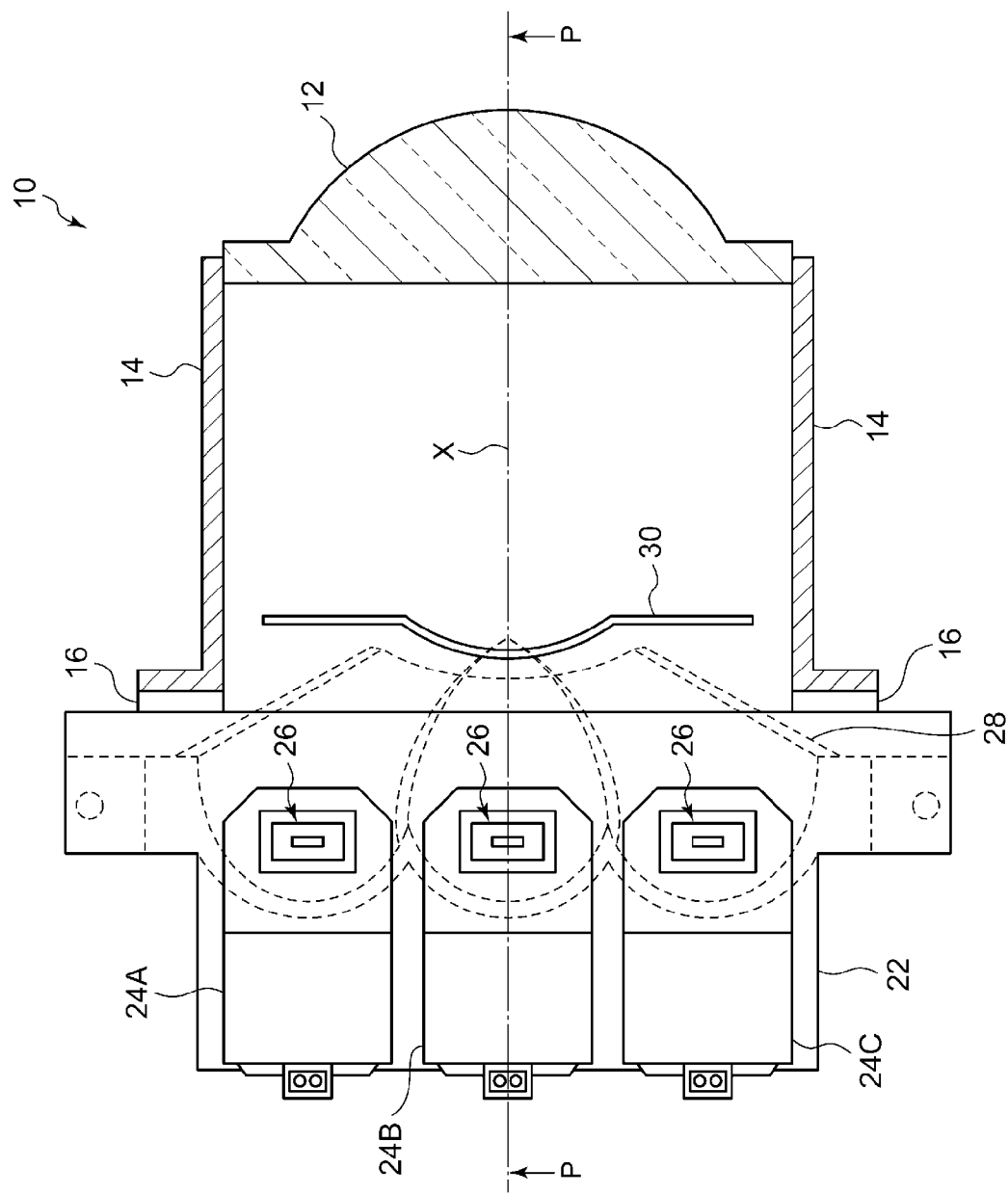
FIG. 1 shows a structure of an automotive headlamp according to an embodiment.
Figure 2:
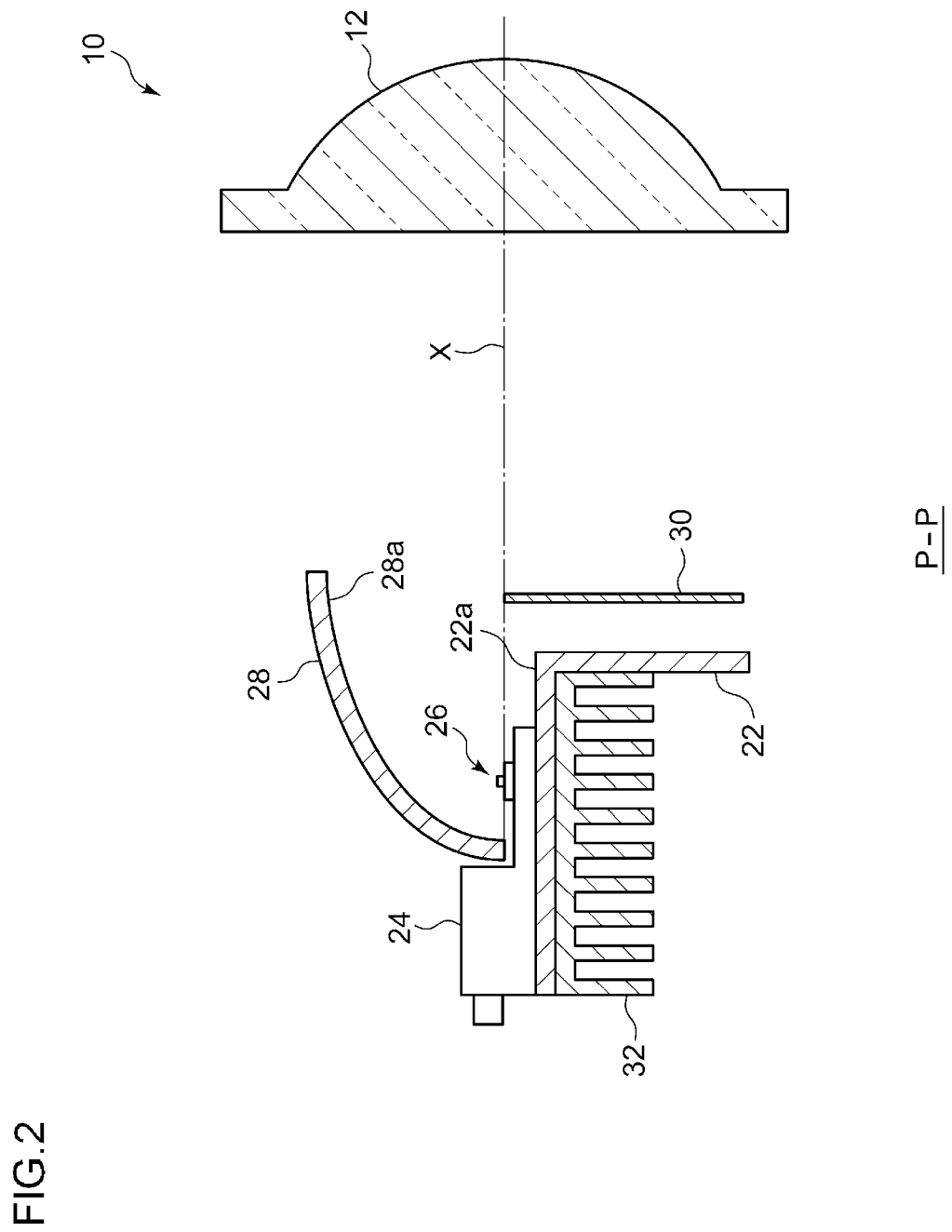
FIG. 2 is a cross-sectional view of FIG. 1 taken along the line P-P.

FIG. 1 shows a structure of an automotive headlamp 10 according to the present embodiment. FIG. 2 is a cross-sectional view of FIG. 1 taken along the line P-P. A description is given hereunder of a structure of the automotive headlamps 10 in conjunction with both FIG. 1 and FIG. 2.

The automotive headlamp 10 includes a projection lens 12, lens supporting members 14, plates 16, supporting members 22, a light-emitting apparatus 24, a light-emitting module 26, a reflector 28, a shade 30, and a heatsink 32. The projection lens 12 is a plano-convex aspheric lens, having a convex front surface and a plane rear surface, which projects a light source image formed on the rear focal plane toward a front area of a lamp as a reverted image. Hereinafter, a description will be given with reference to projection images which are formed on the virtual vertical screen installed 25 meters, for instance, in front of a vehicle. It goes without saying that the virtual plane on which the projection images are supposed to be formed is not limited to such a vertical plane only. For example, the virtual plane may be a horizontal plane that simulates the road surface.

The supporting member 22 is formed such that a plate-like member is bent in an L-shape. One of outer surfaces of the supporting member 22 is a horizontal top face 22a, whereas the other thereof is oriented forward in a direction vertical to an optical axis X of the projection lens 12. The lens supporting member 14 is formed such that a long, thin metal plate is bent in an L-shape. The plate 16 is formed of a long, thin metal plate. Both ends of the projection lens 12 in the horizontal direction are secured to the supporting members 22 by way of a pair of lens supporting members 14 and a pair of plates 16, respectively.

Three light-emitting apparatuses 24 are provided on the top face 22a so that these light-emitting apparatuses 24 are arranged side by side along the direction vertical to the optical axis X. The three light-emitting apparatuses 24 each has the light-emitting module 26 for emitting white light. Each of the three light-emitting apparatuses 24 is arranged such that a lowermost part of a light-emitting section of each light-emitting module 26 coincides with the height of the optical axis X. A description is given hereunder of these three light-emitting apparatuses 24 that are a first light-emitting apparatus 24A, a second light-emitting apparatus 24B, a third light-emitting apparatus 24C, from left to right, facing the projection lens 12. Note that the number of light-emitting apparatuses 24 provided in the automotive headlamp 10 is not limited to three, and note also that a single light-emitting apparatus 24 or a plurality (other than three) of light-emitting apparatuses 24 may be provided in the automotive headlamp 10.

The reflector 28 is so provided as to cover the light-emitting module 26 of each of the three light-emitting apparatuses 24 from above. The reflector 28 has a reflecting surface 28a having three curves surfaces therein so that the reflector 28 can reflect and collect the light emitted by each of the three light-emitting modules 26. As a result, the reflector 28 reflects the light emitted by each of three light-emitting modules 26 through the reflecting surface 28a and collects the reflected light.

The shade 30, which is formed in the shape of a plate, is disposed between the light-emitting section of the light-emitting module 26 and the projection 12. The shade 30 is arranged so that an upper edge of the shade 30 is positioned on the rear focal plane. The shade 30 blocks part of both the light emitted from the light-emitting modules 26 and the light reflected by the reflector 28, thereby forming cutoff lines of a low-beam light distribution pattern described later.

The heatsink 32 is placed below the supporting member 22. The heatsink 32 recovers the heat, generated by the light-emitting apparatuses 24, via the supporting member 22 and releases it to the outside, thereby suppressing the rise in temperature of the light-emitting apparatuses 24.

Figure 3:
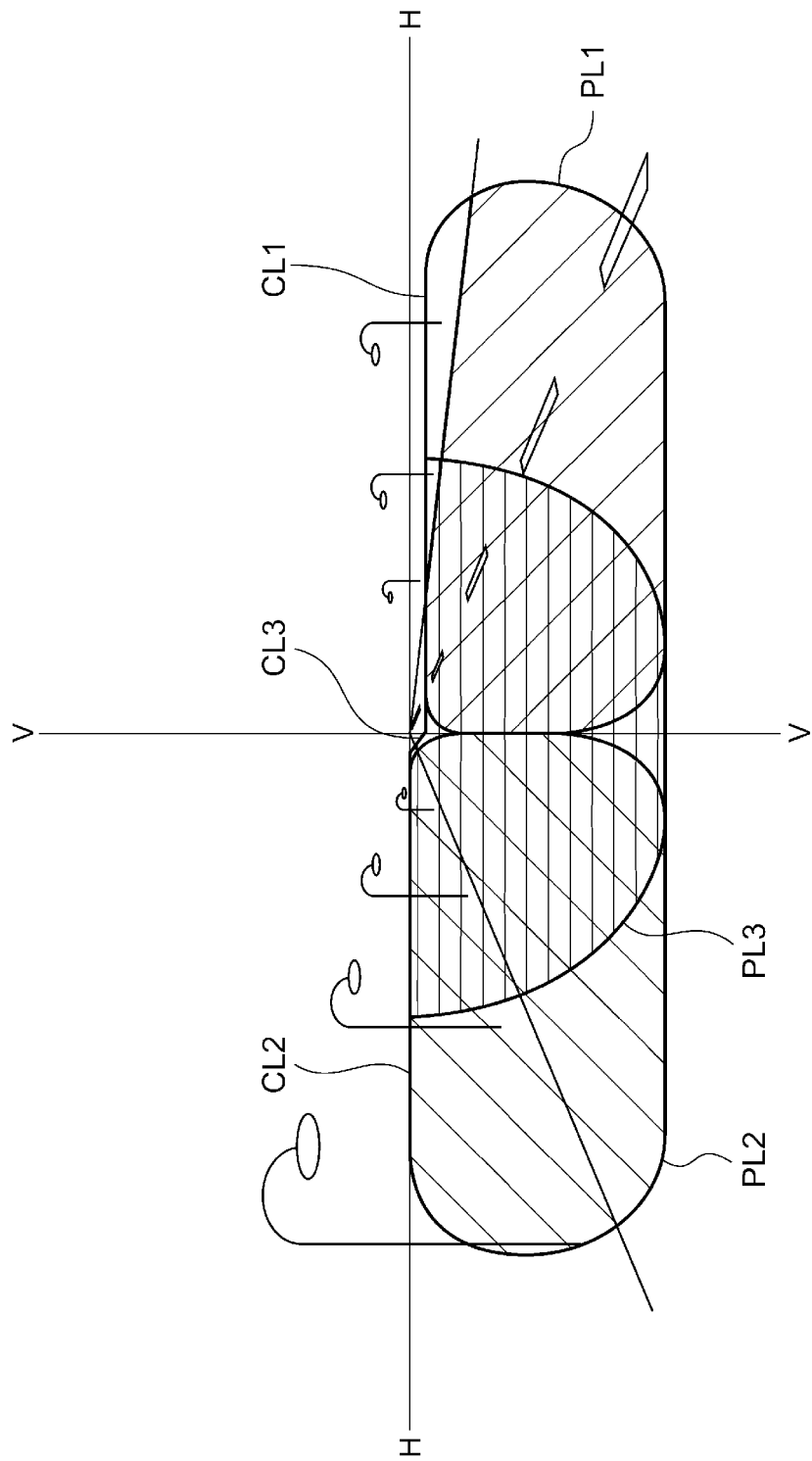
FIG. 3 illustrates a light distribution pattern formed on a virtual vertical screen by automotive headlamps according to an embodiment.

FIG. 3 illustrates a light distribution pattern formed on the virtual vertical screen by the automotive headlamps 10 according to the present embodiment. A low-beam light distribution pattern PL is formed by the automotive headlamps 10. The two automotive headlamps 10 are provided in a left front part and a right front part of a vehicle, respectively. The low-beam light distribution pattern PL is formed by this pair of automotive headlamps 10.

The low-beam distribution pattern PL, which is a left-hand low-beam distribution pattern, has a cutoff line CL1 to a cutoff line CL3 at the top end thereof. The first cutoff line CL1 to the third cutoff line CL3 are configured as follows. That is, the first cutoff line CL1 and the second cutoff line CL2 extend horizontally in such a manner that the first cutoff line CL1 is stepped down from the second cutoff line CL2 with respect to a vertical line V-V serving as the boundary line therebetween and passing through a vanishing point in a frontal direction of the lamp. The first cutoff line CL1 extends horizontally such that the first cutoff line CL1 is located on the right side of the V-V line and is located in a position lower than an H-H line. Thus, the first cutoff line CL1 is used as a cutoff line on the side of an oncoming traffic lane. The cutoff line CL3 extends obliquely from a left end of the first cutoff line CL1 toward upper left at an angle of 45 degrees. The cutoff line CL2 is formed such that it extends along the H-H line on the left side from the intersection of the cutoff line CL3 and the H-H. Thus, the cutoff line CL2 is used as a cutoff line on the side of the driver's own lane.

The low-beam light distribution pattern PL according to the present embodiment is configured by the first light distribution pattern PL1, the second light distribution pattern P12, and the third light distribution pattern PL3. In the low-beam light distribution pattern PL, the first light distribution pattern PL1 constitutes a right side of the V-V line. The first light distribution pattern PL1 is formed by the light emitted by the first light-emitting apparatus 24A.

In the low-beam light distribution pattern PL, the second light distribution pattern PL2 constitutes a left side of the V-V line. The second light distribution pattern PL2 is formed by the light emitted by the third light-emitting apparatus 24C.

In the low-beam light distribution pattern PL, the third light distribution pattern PL3 constitutes a middle part of PL lying across the V-V line. The third light distribution pattern PL3 is formed by the light emitted by the second light-emitting apparatus 24B.

As described above, the light distribution patterns are formed, via the single shade 30 and the projection lens 12, by the use of the light emitted by a plurality of light-emitting apparatuses 24. As a result, the positions of the cutoff lines can be accurately adjusted as compared with a case where the shades 30 and the projections lenses 12 are provided for a plurality of light-emitting apparatuses 24, respectively. Hence, the positions of the light-emitting apparatuses 24 can be adjusted with ease.

Figure 4:
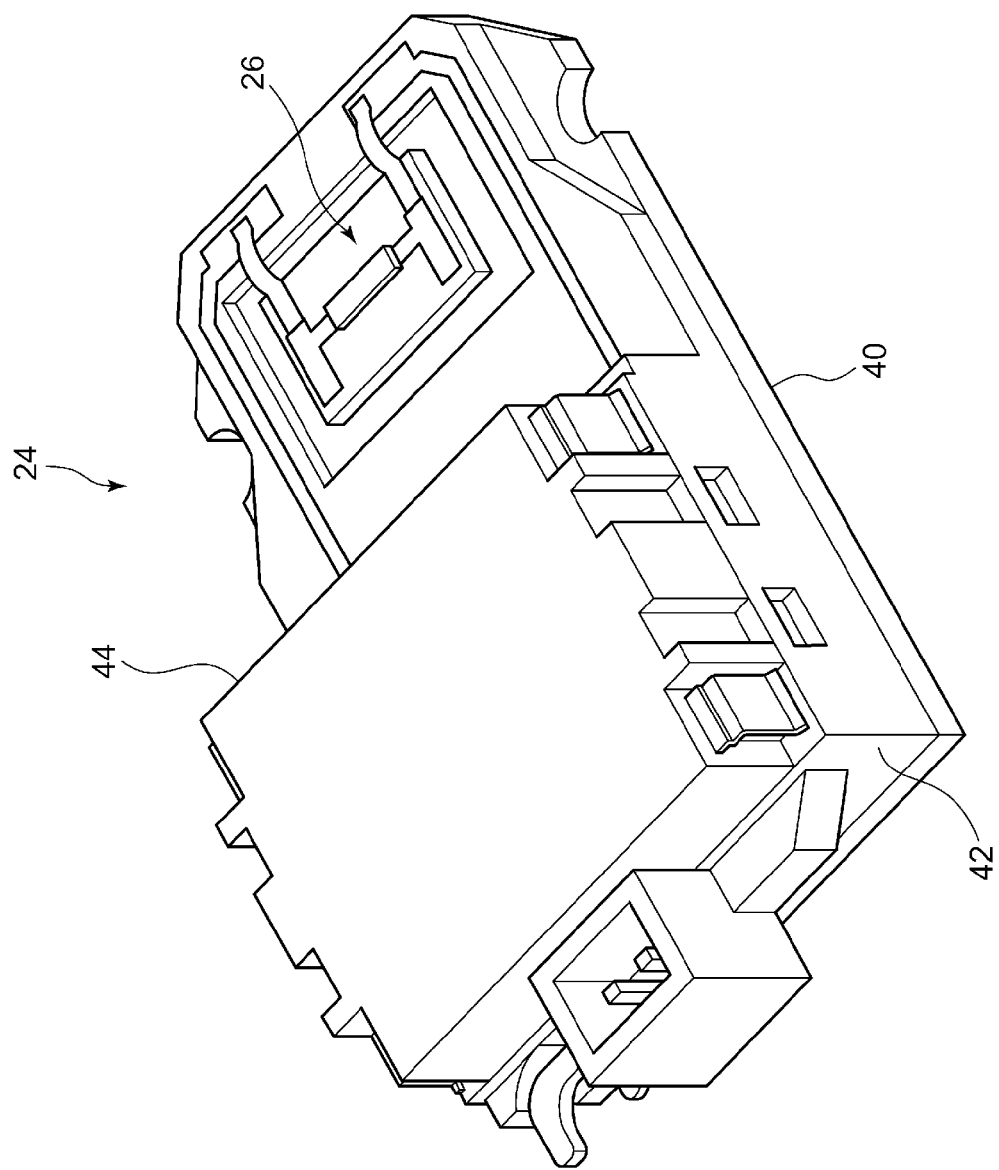
FIG. 4 is a perspective view of a light-emitting apparatus according to an embodiment.

FIG. 4 is a perspective view of the light-emitting apparatus 24 according to the present embodiment. The light-emitting apparatus 24 includes a first unit 40, a second unit 42, and a third unit 44. The first unit 40 is provided with the light-emitting module 26. The light emitting apparatus 24 is constructed by first placing the second unit 42 on the first unit 40 and then the third unit 44 on top of them.

FIG. 5A is a perspective view of the first unit 40, FIG. 5B is a side view of the first unit 40, and FIG. 5C is a top view of the first unit 40. A description will be given below of a structure of the first unit 40 by referring to FIGS. 5A to 5C.

The first unit 40 includes a heat-radiating substrate 50, a light-emitting module 26, and a lower-side circuit unit 60. The heat-radiating substrate 50 is shaped in a rectangular plate made of aluminum which is a heat-dissipating material with excellent thermal conductivity. It is to be noted that heat-dissipating material, such as aluminum alloy, copper, or copper alloy, may be used in the place of aluminum. Provided on an upper surface 50a of the heat-radiating substrate 50 is a raised portion 50b for placing the light emitting module 26 thereon, which is located near one end of the heat-radiating substrate 50 in the extending direction.

The lower-side circuit unit 60 is mounted on the upper surface 50a of the heat-radiating substrate 50 near the other end thereof in the extending direction. In other words, the heat-radiating substrate 50 supports both of the light emitting-module 26 and a control circuit unit 106 on the same side, that is, in positions above the heat-radiating substrate 50. The lower-side circuit unit 60, together with a coil to be discussed later, constitutes a lighting control unit for controlling the lighting of the light-emitting module 26. The lower-side circuit unit 60 is configured with the electronic components mounted on an alumina substrate 62, which is also a heat-dissipating material with excellent thermal conductivity, by the use of solder or some electrically-conductive adhesive. The lower-side circuit unit 60 is firmly fixed to the upper surface 50a of the heat-radiating substrate 50 using an adhesive. At this time, an adhesive which displays a thermal conductivity of 0.5 W/m·K or above and excellent heat radiation is used.

The light emitting module 26 includes a light-emitting section 52 and a sub-mount 54. The sub-mount 54 is shaped in a rectangular plate. The light-emitting section 52 is shaped in a rectangular plate. The light-emitting module 26 is placed on the raised portion 50b of the heat-radiating substrate 50 in such a manner that the light-emitting section 52 extends perpendicular to the optical axis X of the projector lens 12. The light-emitting module 26 is firmly fixed to the heat-radiating substrate 50 by adhesion. At this time, too, an adhesive which displays a thermal conductivity of 2.0 W/m·K or above and excellent heat dissipation is used.

The light-emitting section 52 has a plurality of semiconductor light emitting elements 56 (four of them in the present embodiment) that emit the white light. Each semiconductor light emitting element 56 is formed of a square (1 mm×1 mm) and has an LED. The light-emitting section 52 is structured such that the plurality of semiconductor light emitting elements 56 are installed side by side and vertical to the optical axis X. That is, the direction along which the semiconductors 56 are arranged side by side is vertical to the optical axis X. Note that, in the place of the LED, the semiconductor light emitting element 56 may have another element-like light source, such as a laser diode, which performs surface emitting in approximately point-like manner.

Provided on the upper surface of the sub-mount 54 is an electrode 58. The electrode 58 is so provided as to electrically connect a plurality of semiconductor light emitting elements 56 to each other in series or in parallel.

Thus the heat-radiating substrate 50 supports the light-emitting module 26 and the lower-side circuit unit 60 in such a manner as to recover the heat emanating from each of them. This setup enables recovery of heat from both the light-emitting module 26 and the lower-side circuit unit 60 in a simpler structure than the provision of heat-radiating members for them respectively and can also reduce the space that is occupied by such heat-dissipating members.

The heat-radiating substrate 50, which is formed plane-symmetrically, supports the light-emitting module 26 in such a manner that the center of the light-emitting section 52 is located on the plane of symmetry. This allows the heat-radiating substrate 50 to be used commonly by an automotive headlamp provided on the left side of a vehicle and an automotive headlamp provided on the right side thereof.

Also, the heat-radiating substrate 50 has a pair of fixation recesses 50c near the raised portion 50b. The heat-radiating substrate 50 is secured to the support member 22 with screws that are screwed into the support member 22 passing through the inside of the fixation recesses 50c.

The pair of fixation recesses 50c is located on a straight line passing through the center of the light-emitting section 52 and perpendicular to the optical axis X. Therefore, the heat-radiating substrate 50 is fixed to the support member 22 at two positions which straddle the center of the light-emitting section 52 on the straight line passing through the center of the light-emitting section 52 of the light-emitting module 26. Provision of the fixation recesses 50c in these positions can prevent the lifting of the heat-radiating substrate 50 from the support member 22 below the light-emitting module 26. Thus the heat produced by the light emitting module 26 is conveyed smoothly to the heatsink 32 through the support member 22. It should be noted that the fixation recesses 50c may be provided on one of the other straight lines passing through the center of the light-emitting section 52.

Note that when the heat-radiating substrate 50 is fixed to the support member 22 with screws, ground wire must be led out from screw positions and connected to the support member 22. In this manner, grounding can be assured at the same time as fixing with screws. Also, the fixation of the heat-radiating substrate 50 to the support member 22 is not limited to that with screws. The heat-radiating substrate 50 may be fixed to the support member 22 using rivets, clips, pins, or the like.

Figure 6:
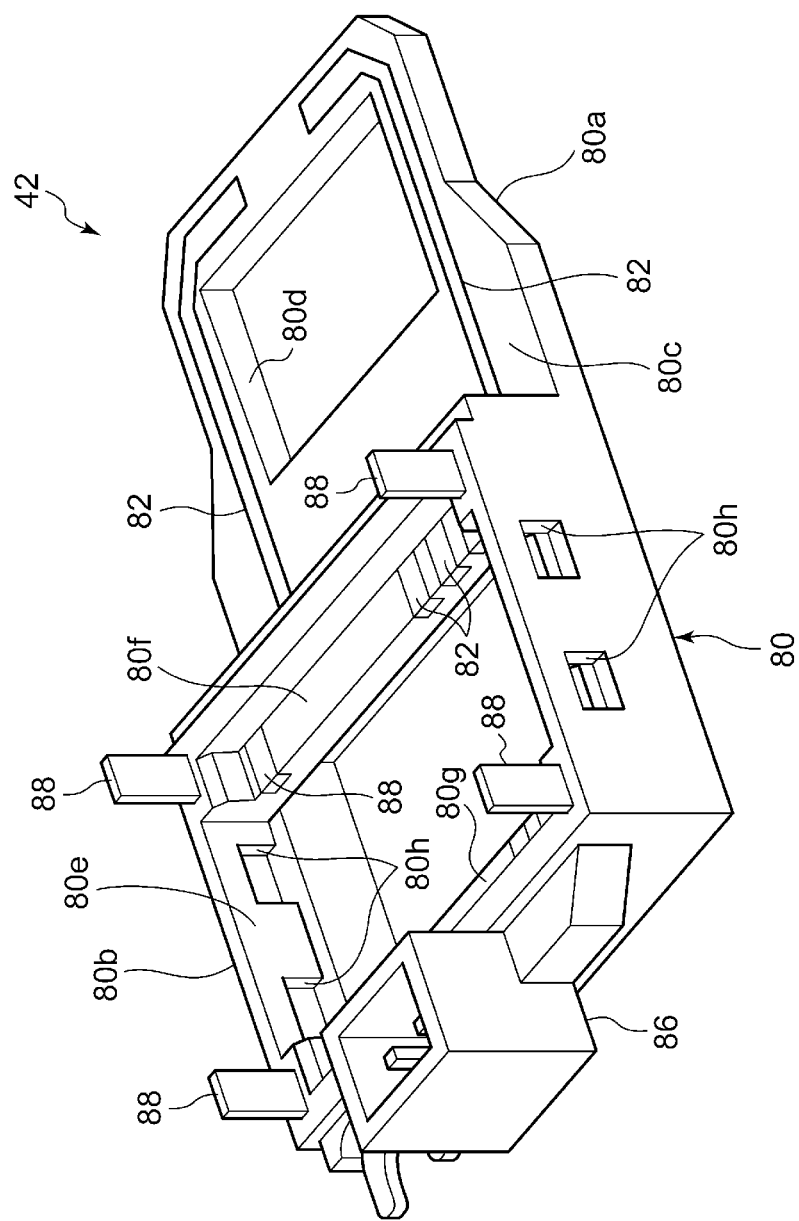
FIG. 6 is a perspective view of a second unit.

FIG. 6 is a perspective view of the second unit 42. The second unit 42 includes a base housing 80, bus bars 82, a connector 86, and bus bars 88. The base housing 80 is formed of a resin. The base housing 80 is constituted by a plate section 80a and a housing section 80b.

The bus bars 82 are used to electrically connect the light-emitting module 26 to the lower-side circuit unit 60. The bus bars 82, formed in strips of electrically-conductive material such as brass or phosphor bronze, are insert-molded into the base housing 80 to be fixed in an upper surface 80c of the plate section 80a thereof. Therefore, the base housing 80 functions as a connection support member for the bus bars 82. Provided in a middle of the plate section 80a is an opening 80d for receiving the light-emitting module 26 therein. The two bus bars 82 are arranged so that each of the two bus bars 82 passes by the opening 80d from the housing section 80b and extends to a position closer to the projector lens 12 than the opening 80d.

Provided inside the housing section 80b is a circuit accommodating area 80e for receiving the lower-side circuit unit 60. The circuit accommodating area 80e is formed such that the circuit accommodating area 80e penetrates the housing section 80b vertically. Provided inside the circuit accommodating area 80e are a first projecting part 80f and a second projecting part 80g. The first projecting part 80f is formed such that the first projecting part 80f projects inward within the circuit accommodating area 80e from a wall in contact with the plate section 80a. The bus bars 82 are installed such that the bus bars 82 are led from the upper surface 80c of the plate section 80a to an upper surface of the first projecting part 80f.

The second projecting part 80g is so formed as to project inward within the circuit accommodating area 80e from a wall opposite to the wall on which the first projecting part 80f is disposed. Provided on the external surface of the housing section 80b, opposite to the wall surface on which the second projecting part 80g is disposed, is the connector 86 for power supply from the outside. A bus bar (not shown) connected to a terminal of the connector 86 is led to an upper surface of the second projecting part 80g.

Also, the bus bars 88 are each formed in an elongate plate bent in an L shape using an electrically-conductive material such as brass or phosphor bronze for weldability. The bus bars 88 are disposed at the four corners of the housing section 80b, respectively. The bus bars 88 are insert-molded into the base housing 80 to be fixed therein in such a manner as to project upward from the upper surface of the housing section 80b. Two of the four bus bars 88 are led to the upper surface of the first projecting part 80f, whereas the other two thereof are led to the upper surface of the second projecting part 80g.

Also, the housing section 80b is provided with locking openings 80h in four positions. These locking openings 80h are used to lock a cover housing 100 to the base housing 80.

Figure 7:
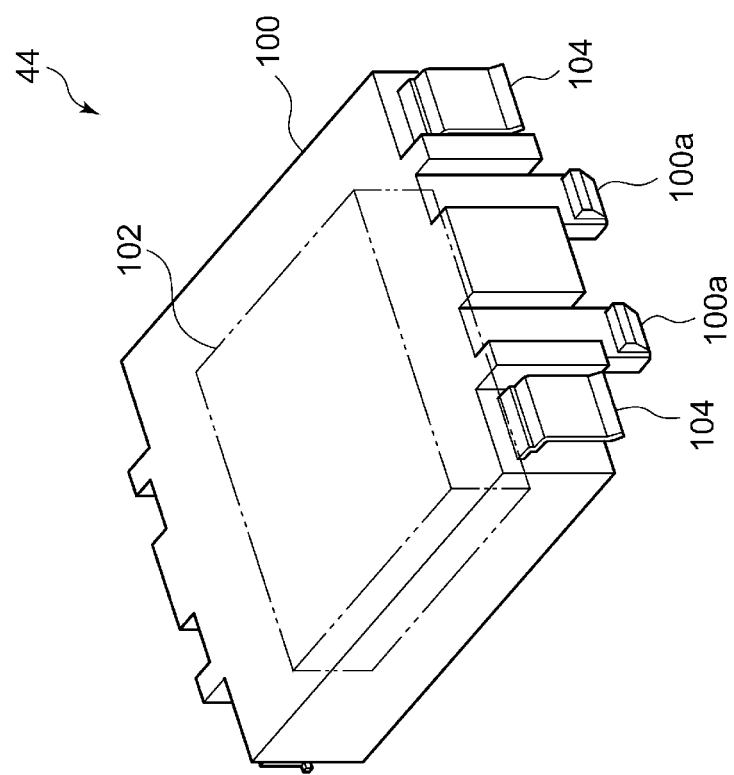
FIG. 7 is a perspective view of a third unit.

FIG. 7 is a perspective view of the third unit 44. The third unit 44 includes a cover housing 100, a coil 102, and bus bars 104. The cover housing 100 is box-shaped with an opening underneath. The coil 102 is used as part of the control circuit unit for controlling the lighting of the light-emitting module 26. The coil 102 is installed within the cover housing 100. Accordingly, the cover housing 100 functions as a circuit unit support member supporting a part of the control circuit unit. The bus bars 104 are each formed in a plate bent in an L shape using an electrically-conductive material such as brass or phosphor bronze for weldability. The bus bars 104 are insert-molded into the cover housing 100 such that they are located near the corners of the cover housing 100, respectively. The bus bars 104 are electrically connected to the coil 102 inside the cover housing 100.

The cover housing 100 has four catches 100a. The catches 100a are each so formed as to face outward from a position even below the opening of the cover housing 100. With these four catches 100a engaging with the four locking openings 80h provided in the base housing 80 respectively, the third unit 44 is fixed to the second unit 42.

Note that, with the third unit 44 installed on the second unit 42, the four bus bars 104 come in contact with the four bus bars 88 of the second unit 42 respectively. In this manner, the coil 102 and the lower-side circuit unit 60 can be easily connected to each other electrically. The bus bars 104 and the bus bars 88 are joined with each other by welding such as laser welding or resistance welding.

Figure 8:
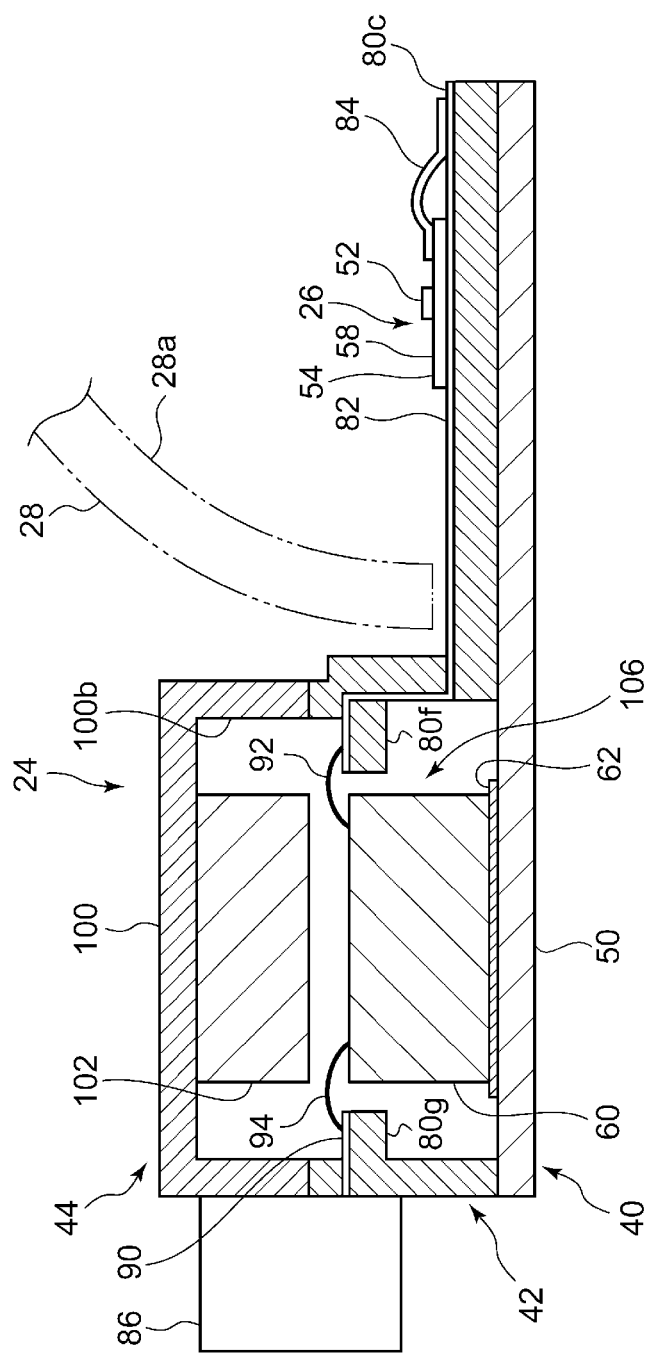
FIG. 8 is a cross-sectional view of a light-emitting apparatus.

FIG. 8 is a cross-sectional view of the light emitting apparatus 24. FIG. 8 shows a cross section of the light emitting apparatus 24 such that the installation path of the bus bar 82 can be observed visually.

The base housing 80, with the bus bars 82 supported thereon, is mounted on the heat-radiating substrate 50. At this time, the light emitting module 26 is received in the opening 80d of the base housing 80. A spot of the bus bar 82 more forward in the light-concentrating direction of the reflector 28 than the light-emitting module 26 and the electrode 58 of the light-emitting module 26 are connected to each other by an aluminum ribbon 84. Note that the light-concentrating direction of the reflector 28 meant here is the direction in which the light emitted by the light-emitting section 52 and reflected by the reflecting surface 28a travels. In the present embodiment, the light-concentrating direction of the reflector 28 is to be understood as the direction of light traveling in parallel with the optical axis X out of the light reflected by the reflecting surface 28a.

Use of the aluminum ribbon 84 assures connection with larger contact area than with connection by Au wire or the like, which in turn improves the long-term reliability. Also, since the aluminum ribbon 84 has a property resistant to twisting and the like, falling of wire or such trouble in the subsequent processes can be prevented. Also, while the Au wire needs a protective member, the aluminum ribbon 84 does not require such a protective member, so that the manufacturing processes of the light-emitting apparatus 24 and the number of components required therefore can be reduced.

In this manner, the bus bar 82, the aluminum ribbon 84, and aluminum ribbon 92 connect the control circuit unit 106 to the light emitting module 26 through an installation path which leads to a spot more forward in the light-concentrating direction of the reflector 28 than the light-emitting module 26 by avoiding the light path used for the concentration of light by the reflector 28 out of the light emitted by the light-emitting module 26.

More specifically, the bus bar 82 extends below a region connecting the reflecting surface 28a of the reflector 28 to the light-emitting section 52 of the light-emitting module 26 and is led to a point more forward in the light-concentrating direction of the reflector 28 than the light-emitting module 26.

The aluminum ribbon 84 connects a forward end in the light-concentrating direction of the thus disposed bus bar 82 to the electrode 58 of the light-emitting module 26. As a result, a situation that the light path is obstructed by an electrically conductive member connecting the light-emitting module 26 to the lower-side circuit unit 60 can be prevented.

Also, the bus bar 82 is supported by the base housing 80 in such a manner that when the base housing 80 is mounted on the heat-radiating substrate 50, the bus bar 82 is led from a neighborhood of the lower-side circuit unit 60 to a point more forward in the light-concentrating direction of the reflector 28 than the light-emitting module 26 by avoiding the light path used for the concentration of light by the reflector 28. Thus, the obstruction of the light path by the bus bar 82 can be prevented with certainty by fixing the bus bar 82 to the base housing 80 in advance and mounting the base housing 80 on the heat-radiating substrate 50.

Also, when the second unit 42 is installed on the first unit 40, the lower-side circuit unit 60 is received inside the circuit accommodating area 80e of the base housing 80. The lower-side circuit unit 60 is connected to the bus bars 82, which are used to connect to the light-emitting module 26, by means of the respective aluminum ribbons 92. Also, provided on an upper surface of the second projecting part 80g are bus bars 90 for connection with the connector 86. The lower-side circuit unit 60 is connected to the bus bars 90 by means of aluminum ribbons 94. Also, the lower-side circuit unit 60 is connected to each of the four bus bars 88 via an aluminum ribbon (not shown). It is to be noted that these connections can be made using electrically conductive wire such as Au wire in the place of the aluminum ribbons.

The cover housing 100 supports the coil 102 in such a manner that when the cover housing is mounted on the second unit 42, the coil 102 received in the circuit accommodating area 100b is placed right above the lower-side circuit unit 60. In this manner, division of the control circuit unit for controlling the lighting of the light-emitting module 26 into a plurality of circuit units and placement of one above the other can reduce the area to be occupied by the control circuit unit.

The control circuit unit 106 for controlling the lighting of the light-emitting module 26 is comprised of the coil 102 and the lower-side circuit unit 60. The light-emitting apparatus 24 is placed on the support member 22 such that the control circuit unit 106 is positioned in a region outside the area having the light-emitting module 26 and the reflector 28 therewithin. As a result, the control circuit unit 106 for controlling the lighting of the light-emitting module 26 can be structured integrally with the light-emitting module 26, and a situation that the light path is obstructed by the control circuit unit 106 can be prevented. Thus, it is not only possible to control the lighting of the light-emitting module 26 smoothly but also to avoid a larger size for the light-emitting apparatus 24 resulting from the provision of the control circuit unit 106 for each of the light-emitting modules 26.

The present invention is not limited to the above-described embodiments only, and those resulting from any combination of the embodiments are also effective as embodiments. Also, it is understood by those skilled in the art that various modifications such as changes in design may be added to the embodiments based on their knowledge and embodiments added with such modifications are also within the scope of the present invention.

In a modification, the automotive headlamp 10 forms a high-beam light distribution pattern instead of a low-beam light distribution pattern. At this time, each of the plurality of light-emitting apparatuses 24 is used to form a different part of the high-beam light distribution pattern. A vehicle is provided with a lighting control unit for controlling the lighting of each of the light-emitting apparatuses 24. The lighting control unit includes a CPU for executing various calculations, a ROM for storing various control programs, and a RAM to be used as work area for storing data and executing programs.

The lighting control unit acquires image data picked up, for instance, by a CCD (charge-coupled device) camera, determines whether or not there are any vehicles in front by analyzing the data, and identifies the positions of them if there are any vehicles in front. Then the lighting control unit gives a control signal to the light-emitting apparatuses 24 to turn off the light-emitting apparatuses 24 which are forming a divided light distribution pattern including the positions of the vehicles present in front. When such a control signal is inputted, the light-emitting apparatuses 24 turn off the lighting by stopping the supply of electric power to the light-emitting modules 26. At this time, provision of the control circuit unit 106 for each of the light-emitting modules 26 of the light-emitting apparatuses 24 proves effective in controlling the lighting of the light-emitting modules 26 smoothly.

The invention claimed is:

1. A light-emitting apparatus comprising:
   a light-emitting module;
   a control circuit unit configured to control the lighting of the light-emitting module;
   a heat-radiating substrate configured to support the light-emitting module and the control circuit unit in such a manner as to recover the heat produced by the light-emitting module and the control circuit unit;
   a connection support unit mounted on the heat-radiating substrate in such a state as to support an electrically conductive member by which to electrically connect the light-emitting module and the control circuit unit; and
   a circuit unit support member mounted on the heat-radiating substrate,
   wherein the control circuit unit includes a first circuit unit and a second circuit unit,
   wherein the heat-radiating substrate supports the first circuit unit, and
   wherein the circuit unit support member supports the second circuit unit in such a manner that when the circuit unit support member is mounted on the heat-radiating substrate, the second circuit unit is placed on the first circuit unit.

2. A light-emitting apparatus according to claim 1, further comprising a substrate support member supporting the heat-radiating substrate,
   wherein the heat-radiating substrate is fixed to the substrate support member at a plurality of positions that straddle a center of a light-emitting section of the light-emitting module on a straight line passing through the center of the light-emitting section thereof.

3. A light-emitting apparatus according to claim 1, wherein the heat-radiating substrate is formed plane-symmetrically, and
   the heat-radiating substrate supports the light-emitting module in such a manner that a center of a light-emitting section is located on a plane of symmetry.

4. An automotive headlamp comprising:
   a light-emitting apparatus; and
   an optical member configured to collect light emitted by the light-emitting apparatus,
   the light emitting apparatus including:
   a light-emitting module;
   a control circuit unit configured to control the lighting of the light-emitting module;

a heat-radiating substrate configured to support the light-emitting module and the control circuit unit in such a manner as to recover the heat produced by the light-emitting module and the control circuit unit;

a connection support unit mounted on the heat-radiating substrate in such a state as to support an electrically conductive member by which to electrically connect the light-emitting module and the control circuit unit; and a circuit unit support member mounted on the heat-radiating substrate, wherein the control circuit unit includes a first circuit unit and a second circuit unit, wherein the heat-radiating substrate supports the first circuit unit, and wherein the circuit unit support member supports the second circuit unit in such a manner that when the circuit unit support member is mounted on the heat-radiating substrate, the second circuit unit is placed on the first circuit unit.

5. An automotive headlamp according to claim 4, wherein the heat-radiating substrate is formed plane-symmetrically, and the heat-radiating substrate supports the light-emitting module in such a manner that a center of a light-emitting section is located on an axis of symmetry.

6. An automotive headlamp according to claim 4, wherein the optical members include a reflector that reflects, through an inner surface of the reflector, light emitted by the light-emitting module and collects the reflected light, and wherein the control circuit unit is positioned in a region outside the reflector.

7. An automotive headlamp according to claim 6, wherein the electrically conductive member is led from the control circuit unit to a spot more forward in a light-concentrating direction of the reflector than the light-emitting module in a manner such that a light path where light, in the light emitted by the light-emitting module, which is collected by the reflector, passes is avoided.

8. A light-emitting apparatus according to claim 4, further comprising a substrate support member supporting the heat-radiating substrate, wherein the heat-radiating substrate is fixed to the substrate support member at a plurality of positions that straddle a center of a light-emitting section of the light-emitting module on a straight line passing through the center of the light-emitting section thereof.

* * * * *